United States Patent
Ye

(10) Patent No.: US 10,474,214 B2
(45) Date of Patent: Nov. 12, 2019

(54) DATA STORAGE DEVICE AND METHOD FOR MONITORING POWER STORAGE CAPABILITY OF SECONDARY POWER OF DATA STORAGE DEVICE

(71) Applicant: Shannon Systems Ltd., Shanghai (CN)

(72) Inventor: Xiawei Ye, Shanghai (CN)

(73) Assignee: SHANNON SYSTEMS LTD., Shanghai (CN)

(*) Notice: Subject to any disclaimer, the term of this patent is extended or adjusted under 35 U.S.C. 154(b) by 184 days.

(21) Appl. No.: 15/667,703

(22) Filed: Aug. 3, 2017

(65) Prior Publication Data
US 2018/0181184 A1 Jun. 28, 2018

(30) Foreign Application Priority Data
Dec. 28, 2016 (CN) .......................... 2016 1 1232757

(51) Int. Cl.
| G06F 1/3212 | (2019.01) |
| G06F 1/3209 | (2019.01) |
| H02J 3/00 | (2006.01) |
| H02J 9/04 | (2006.01) |
| G01R 31/3835 | (2019.01) |

(52) U.S. Cl.
CPC ....... *G06F 1/3212* (2013.01); *G01R 31/3835* (2019.01); *G06F 1/3209* (2013.01); *H02J 3/005* (2013.01); *H02J 9/04* (2013.01)

(58) Field of Classification Search
CPC . G06F 1/28; G06F 1/30; G06F 1/3209; G06F 1/3212; G01R 31/3835; H02J 3/005; H02J 7/0029; H02J 7/0068; H02J 7/0086; H02J 7/345; H02J 9/04
See application file for complete search history.

(56) References Cited

U.S. PATENT DOCUMENTS

| 2006/0038692 A1* | 2/2006 | Schnetker ............ G01R 31/343 340/635 |
| 2008/0013224 A1* | 1/2008 | Kim ...................... H02J 7/0029 361/16 |
| 2011/0185211 A1* | 7/2011 | Chiasson .................. G06F 1/30 713/340 |
| 2013/0094262 A1* | 4/2013 | Avrutsky ............. G01R 31/028 363/125 |
| 2014/0278168 A1* | 9/2014 | Rogers ................. G01R 31/392 702/63 |
| 2015/0135008 A1* | 5/2015 | Lucas ................. G06F 11/2017 714/14 |

FOREIGN PATENT DOCUMENTS

| TW | I442851 B | 1/2014 |
| TW | 201543206 A | 11/2015 |

* cited by examiner

*Primary Examiner* — Terrell S Johnson
(74) *Attorney, Agent, or Firm* — McClure, Qualey & Rodack, LLP

(57) ABSTRACT

An apparatus and method for monitoring the power storage capability of a secondary power source of a data storage device is provided. A capacitor is used as a secondary power source. A charging path and a discharging path are selectively generated for the capacitor. After being charged through the charging path, the capacitor is then discharged through the discharging path while the charging path is disconnected from the capacitor. Then, the capacitor is checked to determine whether its voltage level has dropped below a threshold level and thereby an evaluation result obtained from evaluating the capacitor is generated.

20 Claims, 7 Drawing Sheets

DATA STORAGE DEVICE AND METHOD FOR MONITORING POWER STORAGE CAPABILITY OF SECONDARY POWER OF DATA STORAGE DEVICE

CROSS REFERENCE TO RELATED APPLICATIONS

This application claims priority of China Patent Application No. 201611232757.9, filed on Dec. 28, 2016, the entirety of which is incorporated by reference herein.

BACKGROUND OF THE INVENTION

Field of the Invention

The present invention relates to the monitoring of a secondary power source of a data storage device.

Description of the Related Art

A non-volatile memory is usually used in a data storage device for permanent storage of data. To avoid accessing the non-volatile memory too frequently, a data storage device usually uses a volatile memory for temporary storage of dynamically-changed data.

However, when an unexpected power-off event occurs, the data temporarily stored in the volatile memory may be lost before being updated to the non-volatile memory.

BRIEF SUMMARY OF THE INVENTION

A data storage device in accordance with an exemplary embodiment of the disclosure uses a capacitor as a secondary power source that provides secondary power for the data storage device when an unexpected power-off event occurs. The data storage device comprises a charging path switching circuit, a discharging path switching circuit, a voltage level detection circuit, and a controller. The charging path switching circuit is operative to selectively provide a charging path for the capacitor. The discharging path switching circuit is operative to selectively provide a discharging path for the capacitor. The voltage level detection circuit detects and determines whether the voltage level of the capacitor drops below a threshold level and, accordingly, an evaluation result obtained from evaluating the capacitor is generated. The controller controls the charging path switching circuit and the discharging path switching circuit. After controlling the charging path switching circuit to provide the charging path to charge the capacitor, the controller breaks the charging path and is switched to control the discharging path switching circuit to provide the discharging path to discharge the capacitor. After the charging and discharging of the capacitor, the controller operates the voltage level detection circuit to detect and determine the voltage level of the capacitor to generate an evaluation result. The evaluation result is used in judging the power storage capability of the capacitor.

A method for monitoring the power storage capability of a second power source of a data storage device is also disclosed in the disclosure. The method includes the following steps: selectively providing a charging path for a capacitor and selectively providing a discharging path for the capacitor, wherein the capacitor is operative to provide secondary power for the data storage device when an unexpected power-off event occurs; and, after using the charging path to charge the capacitor and then disconnecting the charging path and using the discharging path to discharge the capacitor, detecting and determining whether the voltage level of the capacitor drops below a threshold level and, accordingly, generating an evaluation result obtained from evaluating the capacitor. The evaluation result is used in judging the power storage capability of the capacitor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
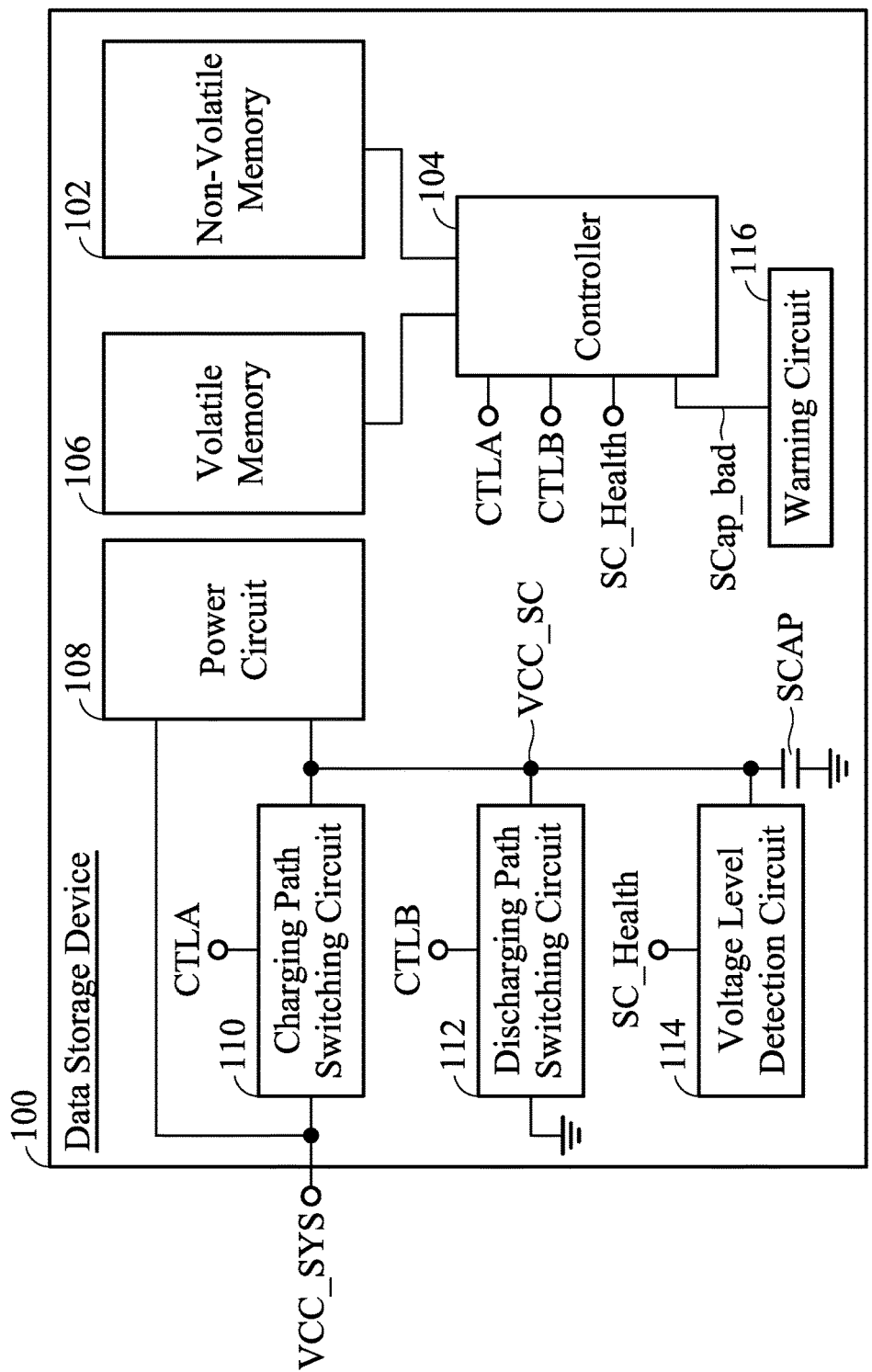
FIG. 1 depicts a data storage device 100 in accordance with an exemplary embodiment of the disclosure.

FIG. 1 depicts a data storage device 100 in accordance with an exemplary embodiment of the disclosure. The data storage device 100 includes a non-volatile memory 102, a controller 104, a volatile memory 106, a power circuit 108, a capacitor SCAP, a charging path switching circuit 110, a discharging path switching circuit 112, a voltage level detection circuit 114, and a warning circuit 116.

The non-volatile memory 102 is for permanent storage of data. When operating the non-volatile memory 102, the controller 104 may use the volatile memory 106 for temporary storage of dynamically-changed data. When an unexpected power-off event occurs on the data storage device 100, the capacitor SCAP plays the role of a secondary power supply to supply power to components like the non-volatile memory 102, the controller 104 and the volatile memory 106. Thus, the controller 104 keeps working to update the dynamically-changed data from the volatile memory 106 to the non-volatile memory 102 to prevent data loss. As shown, the power circuit 108 used for various power needs in the data storage device 100 receives system power VCC_SYS from outside of the data storage device 100 and is further coupled to the capacitor SCAP to obtain secondary power VCC_SC. In some exemplary embodiments, the non-volatile memory 102 is a flash memory and the data storage device 100 may be a solid-state disk (SSD). In other exemplary embodiments, the non-volatile memory 102 may be a magnetoresistive RAM, a ferroelectric RAM, a resistive RAM, and so on, which is a memory used for long-term data storage. The volatile memory 106 may be a dynamic random access memory (DRAM) or a static random access memory (SRAM).

To guarantee that the capacitor SCAP is working normally, the power storage capability of the capacitor SCAP is monitored in the disclosure. The charging path switching circuit 110 may selectively provide a charging path. According to the selectively provided charging path, the capacitor SCAP can be charged by the system power source VCC_SYS. The discharging path switching circuit 112 may selectively provide a discharging path. According to the selectively provided discharging path, the capacitor SCAP can be discharged to the ground. The voltage level detection circuit 114 detects the voltage level of the capacitor SCAP. The controller 104 operates the charging path switching circuit 110 and the discharging path switching circuit 112 and, accordingly, uses the voltage level detection circuit 114 to detect the voltage level VCC_SC of the capacitor SCAP and thereby the power storage capability of the capacitor SCAP is monitored.

In an exemplary embodiment, by breaking (or not providing) the charging path and, after a time interval (depending on the ideal power capacity of the capacitor SCAP), building (or providing) the discharging path, the voltage level VCC_SC of the capacitor SCAP drops. When the voltage level VCC_SC of the capacitor SCAP drops to a lower voltage level than a threshold level, the controller 104 evaluates that the capacitor SCAP malfunctions (a capacitor-fail evaluation). In an exemplary embodiment, the length of time from building the discharging path to the point at which the voltage level VCC_SC of the capacitor SCAP drops below the threshold level is counted. The controller 104 determines the power storage capability of the capacitor SCAP based on the length of time. In an exemplary embodiment, the controller 104 builds the discharging path after the charging path has been broken for a delay time. Furthermore, before controlling the voltage level detection circuit 114 to detect the voltage level VCC_SC of the capacitor SCAP, the controller 104 may wait until the discharging path has been established for a predetermined time interval. Specifically, the capacitor SCAP may not be regarded as a damaged capacitor by just one capacitor-fail evaluation result. In other exemplary embodiments, the capacitor SCAP is regarded as a damaged capacitor due to N accumulated capacitor-fail evaluation results. In this manner, the voltage drop on the voltage level VCC_SC of the capacitor SCAP caused by unexpected power-off events can be excluded from consideration. Erroneously regarding the capacitor SCAP as a damaged capacitor is effectively prevented.

As shown, the charging path switching circuit 110 may be established or broken by a charging path control signal CTLA. The discharging path switching circuit 112 may be established or broken by a discharging path control signal CTLB. The result of the detection that the voltage level detection circuit 114 performs on the capacitor SCAP may be represented by a signal SC_Health. The controller 104 may provide general-purpose input/output (GPIO) pins to output the charging path control signal CTLA and the discharging path control signal CTLB, and to receive the signal SC_Health. The charging path switching circuit 110, the discharging path switching circuit 112, and/or the voltage level detection circuit 114 may be arranged outside the chip of the controller 104.

In an exemplary embodiment, after capacitor-fail evaluation results based on the signal SC_Health have occurred N times, the controller 104 asserts a capacitor damage signal SCap_bad to indicate that the capacitor SCap has been damaged. The warning circuit 116 may include a warning light. In other exemplary embodiments, the warning light may be replaced by a buzzer or another sound or light generator. The warning circuit 116 may activate the warning light when the capacitor damage signal SCap_bad is asserted. In another exemplary embodiment, the data storage device 100 may output the capacitor damage signal SCap_bad to an electronic system (e.g., to the host that the data storage device 100 is mounted on) to activate a warning procedure of the electronic system to inform the user of the damaged capacitor SCAP.

Figure 2:
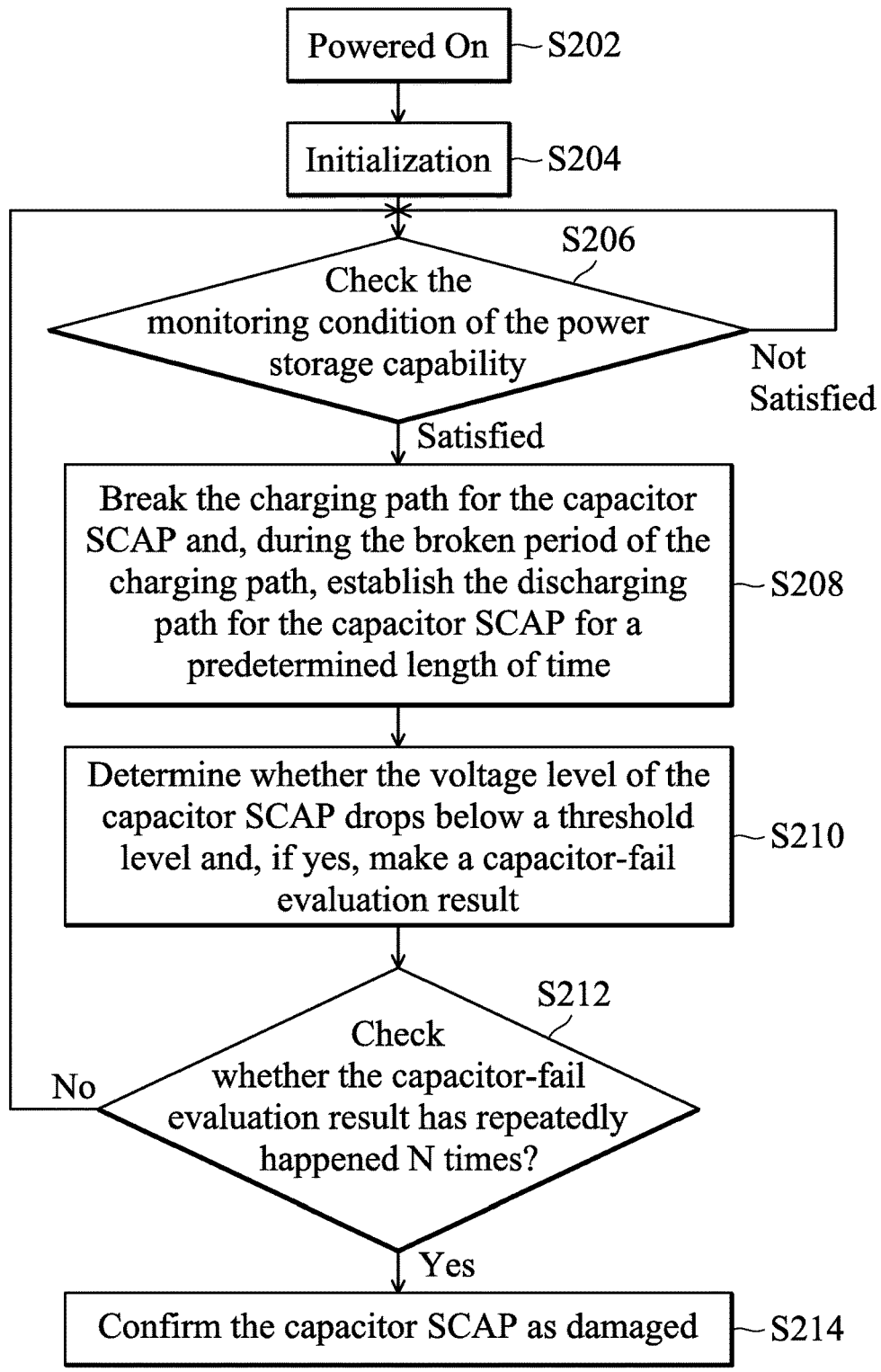
FIG. 2 is a flowchart depicting how to monitor the power storage capability of the capacitor SCAP of the data storage device 100 in accordance with an exemplary embodiment of the disclosure.

FIG. 2 is a flowchart depicting how to monitor the power storage capability of the capacitor SCAP of the data storage device 100 in accordance with an exemplary embodiment of the disclosure. After the data storage device 100 is powered on in step S202, step S204 is performed to initialize the capacitor SCAP by establishing the charging path and the discharging path of the capacitor SCAP at the proper points in time. The data storage device 100 then operates normally and the charging path of the capacitor SCAP may be established and the discharging path of the capacitor SCAP may be broken. During the normal operation of the data storage device 100, step S208 is performed when the monitoring condition checked in step S206 of the power storage capability of the capacitor SCAP is satisfied. For example, the power storage capability of the capacitor SCAP may be checked every 30 minutes. In step S208, the charging path for the capacitor SCAP is broken and the discharging path for the capacitor SCAP is established for a predetermined length of time during the broken period of the charging path. Thus, the voltage level VCC_SC of the capacitor SCAP drops. In step S210, it is determined whether the voltage level of the capacitor SCAP drops below a threshold level. If yes, a capacitor-fail evaluation result is made. It is determined in step S212 whether the capacitor-fail evaluation result has repeatedly happened N times. If yes, the capacitor SCAP is confirmed damaged in step S214. The damaged status of the capacitor SCAP will be announced so that the user may take safety measures before any unexpected power-off events to avoid data loss caused by a failure of the secondary power of the non-volatile memory 102, the controller 104, and the volatile memory 106.

Figure 3A:
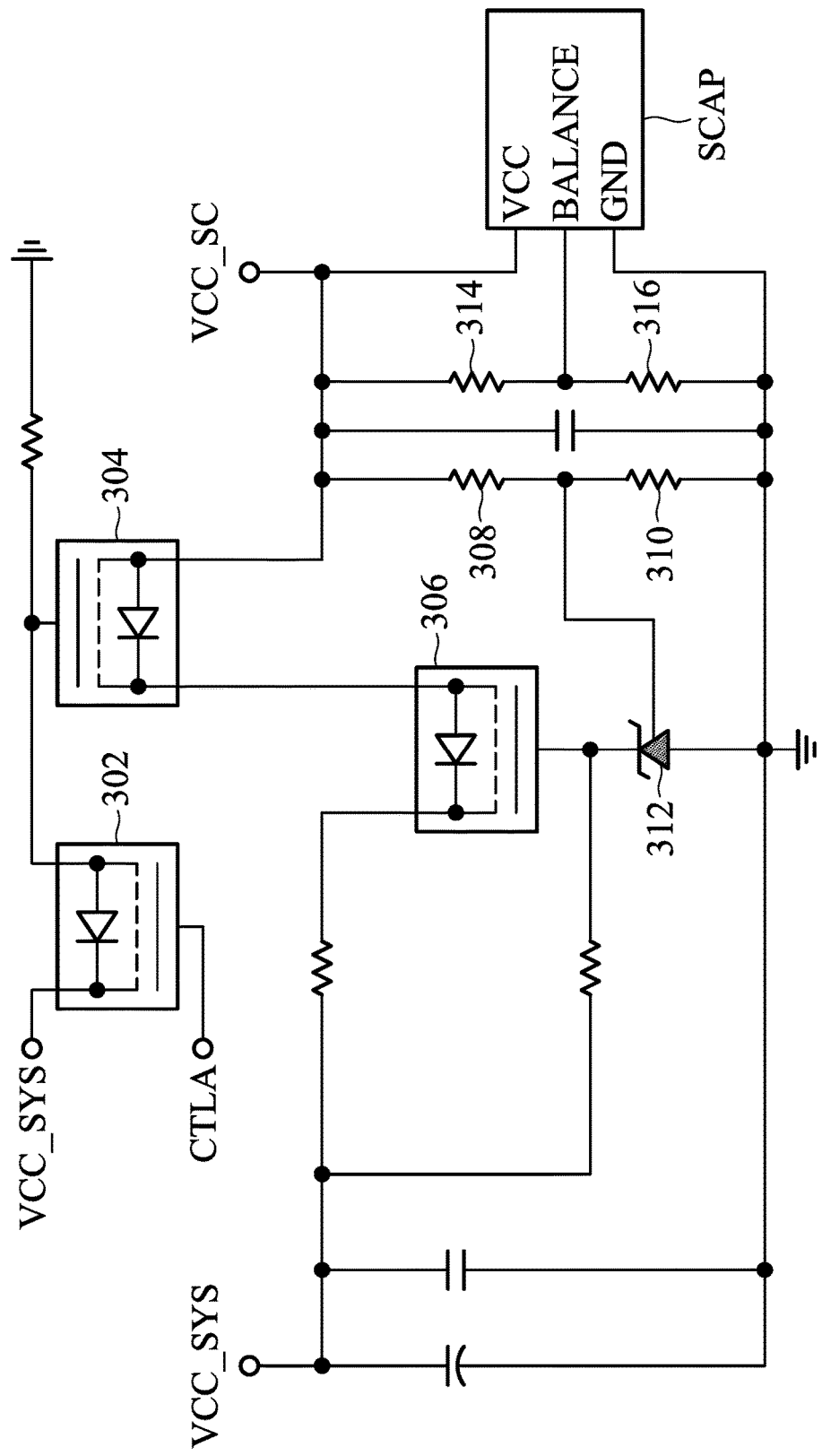
FIG. 3A depicts the charging path switching circuit 110 in accordance with an exemplary embodiment of the disclosure.

FIG. 3A depicts the charging path switching circuit 110 in accordance with an exemplary embodiment of the disclosure. The switches 302, 304 and 305 may be implemented by MOSFETs (Metal-Oxide-Semiconductor Field-Effect Transistors). The switches 302 and 304 are coupled between the system power source VCC_SYS and the capacitor SCAP. The switch 302 controls the switch 304 to a closed (turned-on) status or an open (turned-off) status. The charging path control signal CTLA is provided to turn the switch 302 on or off and thereby indirectly controls the status of the switch 304. When the switch 304 is closed, the charging path for the capacitor SCAP is established. The system power source VCC_SYS is coupled to the capacitor SCAP (at an anode of the second power source) through the switches 306 and 304.

The charging path is broken by opening the switch 304. In this exemplary embodiment, the system power source VCC_SYS is at a voltage level of 5V and the operational level of the voltage VCC_SC provided by the capacitor SCAP is 4.2V. The voltage difference between the system power source VCC_SYS and the secondary power source VCC_SC is 0.8V, due to the voltage drops of the closed switches 302 and 304 plus the voltage drops of passive components (like resistors). In other exemplary embodiments, the charging path between the system power source VCC_SYS and the capacitor SCAP may be established by other switching circuits or other switching components. Specifically, because the operational level of the charging path control signal CTLA output from a general-purpose input/output (GPIO) pin is 3.3V, lower than the operational level (4.2V) of the voltage VCC_SC of the capacitor SCAP, the charging path control signal CTLA may be directly applied on switch 302 and thereby indirectly applied on switch 304 when building or breaking the charging path.

Figure 3B:
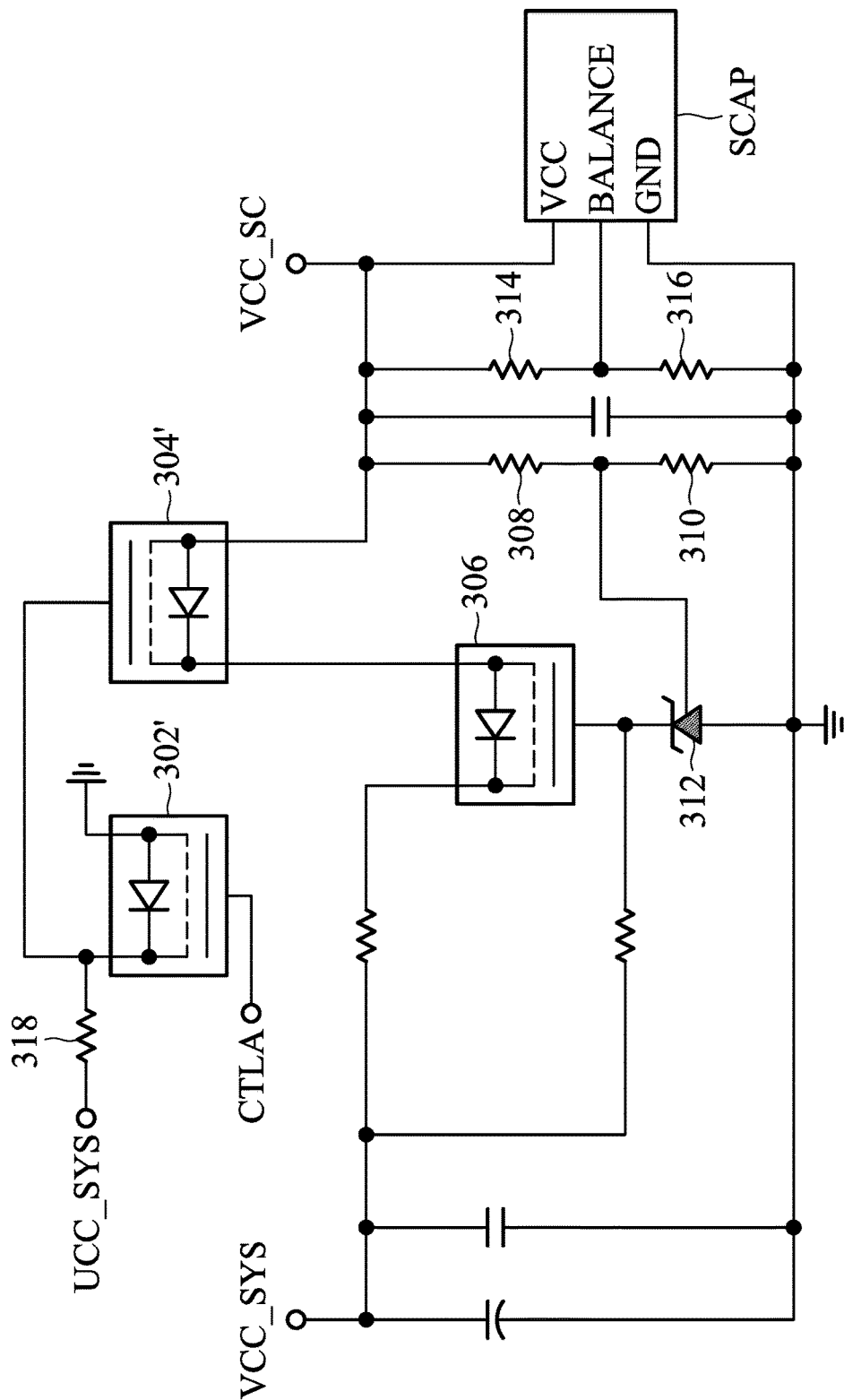
FIG. 3B depicts the charging path switching circuit 110 in accordance with another exemplary embodiment of the disclosure.

FIG. 3B depicts the charging path switching circuit 110 in accordance with another exemplary embodiment of the disclosure. Only the differences between FIGS. 3A and 3B are discussed herein. The switch 302' has one end coupled to a resistor 318 and also coupled to a control terminal of the switch 304' (gate of MOS). The resistor 318 is further coupled to the system power source VCC_SYS. Thus, the operations (being turned on or off) of the switch 304' depends on the status of the switch 302'. Another end of the switch 302' is grounded. The charging path control signal CTLA may turn on or off the switch 302' and thereby the switch 304' is turned on and off accordingly. One end of the switch 304' is coupled to a switch 306 while another end of the switch 306 is coupled to a capacitor SCAP (as an anode of a power supply). Thus, when the switch 304' is turned on a charging path is established. The system power source VCC_SYS is coupled to the capacitor SCAP (at the anode) by the switches 306 and 304'. When the switch 304 is turned off (open), the charging path is broken.

As shown, resistor 308 and resistor 310 are coupled in series as a voltage divider to provide a first reference voltage to a control terminal of a programmable Zener diode 312 to control (to close or open) the switch 306 via the Zener diode 312 and to protect the charging path switching circuit 110 by electrostatic discharging (ESD) via the programmable Zener diode 312. Resistor 314 and resistor 316 are coupled in series as a voltage divider to provide a second reference voltage to a charging/discharging protection circuit within the capacitor SCAP, which is not detailed further in this specification.

In some exemplary embodiments, passive elements like resistors, capacitors and inductors and so on may be added to the charging path switching circuit 110 depending on the designer to filter the signal or reduce power dissipation without changing the function of the charging path switching circuit 110.

Figure 4:
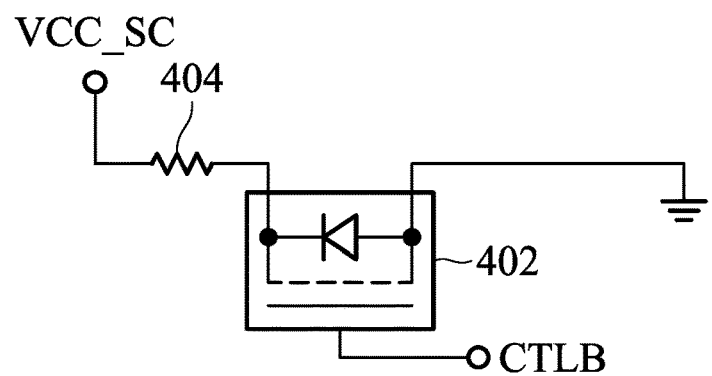
FIG. 4 depicts the discharging path switching circuit 112 in accordance with an exemplary embodiment of the disclosure.

FIG. 4 depicts the discharging path switching circuit 112 in accordance with an exemplary embodiment of the disclosure. The switch 402 is coupled between the anode of the secondary power source (the capacitor SCAP) and the ground terminal and is operated according to the status of the discharging path control signal CTLB to establish or break a discharging path between the capacitor SCAP and the ground terminal. The resistor 404 is provided in the discharging path and the discharging time of the capacitor SCAP depends on the resistance of the resistor 404.

Figure 5:
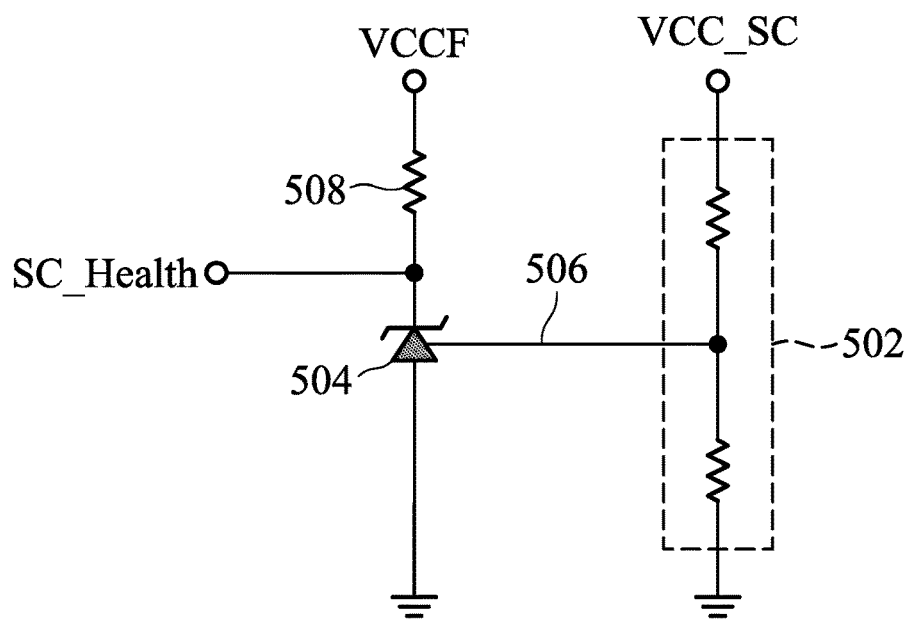
FIG. 5 depicts the voltage level detection circuit 114 in accordance with an exemplary embodiment of the disclosure.

FIG. 5 depicts the voltage level detection circuit 114 in accordance with an exemplary embodiment of the disclosure, which includes a voltage divider 502 and a programmable Zener diode 504. The voltage divider 502 comprises two resistors coupled in series and the voltage level VCC_SC of the capacitor SCAP is divided by the voltage divider 502 to generate a divided voltage 506. The programmable Zener diode 504 and a resistor 508 are connected in series between a power source VCCF and the ground terminal. Because the operational level of a GPIO pin is 3.3V, the preferred voltage level of the power source VCCF is also 3.3V. In other exemplary embodiments, the power source VCCF is set to an operational level just lower than or equal to the operational level of the system power source VCC_SYS. The divided voltage 506 is input to the control terminal of the programmable Zener diode 504 and the programmable Zener diode 504 is operated accordingly. When the voltage level VCC_SC of the capacitor SCAP drops below the threshold level (e.g., the voltage level VCC_SC drops from 4.2V to 3.0V lower than the threshold level 3.3V), the programmable Zener diode 504 is turned on to pull down the voltage level of the signal SC_Health. The controller 104 that detects the voltage level VCC_SC of the signal SC_Health, therefore, determines that the signal SC_Health is at logic '0'. Conversely, when the dropped voltage level VCC_SC of the capacitor SCAP is still greater than or equal to the threshold level (e.g., the voltage level VCC_SC drops from 4.2V to 4.0V), the programmable Zener diode 504 is turned off. Thus, the voltage level of the signal SC_Health is kept at the voltage level of the power source VCCF. The controller 104 that detects the voltage level VCC_SC of the signal SC_Health, therefore, determines that the signal SC_Health is at logic '1'. In this manner, the controller 104 may obtain the status of the capacitor SCAP based on the different results of the voltage detection of the signal SC_Health.

Figure 6:
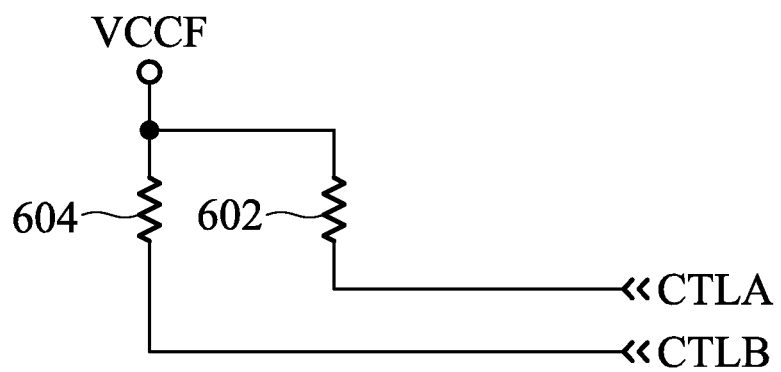
FIG. 6 depicts a design for the general-purpose input/output (GPIO) pins of the controller 104 in accordance with an exemplary embodiment of the disclosure.

FIG. 6 depicts a design for the general-purpose input/output (GPIO) pins of the controller 104 in accordance with an exemplary embodiment of the disclosure. In this exemplary embodiment, pull-up resistors 602 and 604 external to the controller 104 are provided to pull up the charging path control signal CTLA and the discharging path control signal CTLB in a normal state (default setting). The power source VCCF may be that power source providing power to the power terminal of the controller 104.

Figure 7:
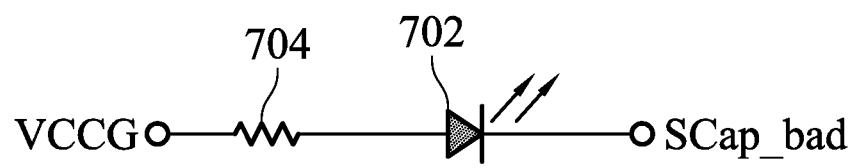
FIG. 7 depicts a warning circuit 116 in accordance with an exemplary embodiment of the disclosure.

FIG. 7 depicts a warning circuit 116 in accordance with an exemplary embodiment of the disclosure, which includes a warning light 702 and a resistor 704 and is coupled to a power source VCCG. Based on the capacitor damage signal SCap_bad, the warning light 702 is turned on (when the capacitor damage signal SCap_bad is low) or off (when the capacitor damage signal SCap_bad is high).

Figure 8:
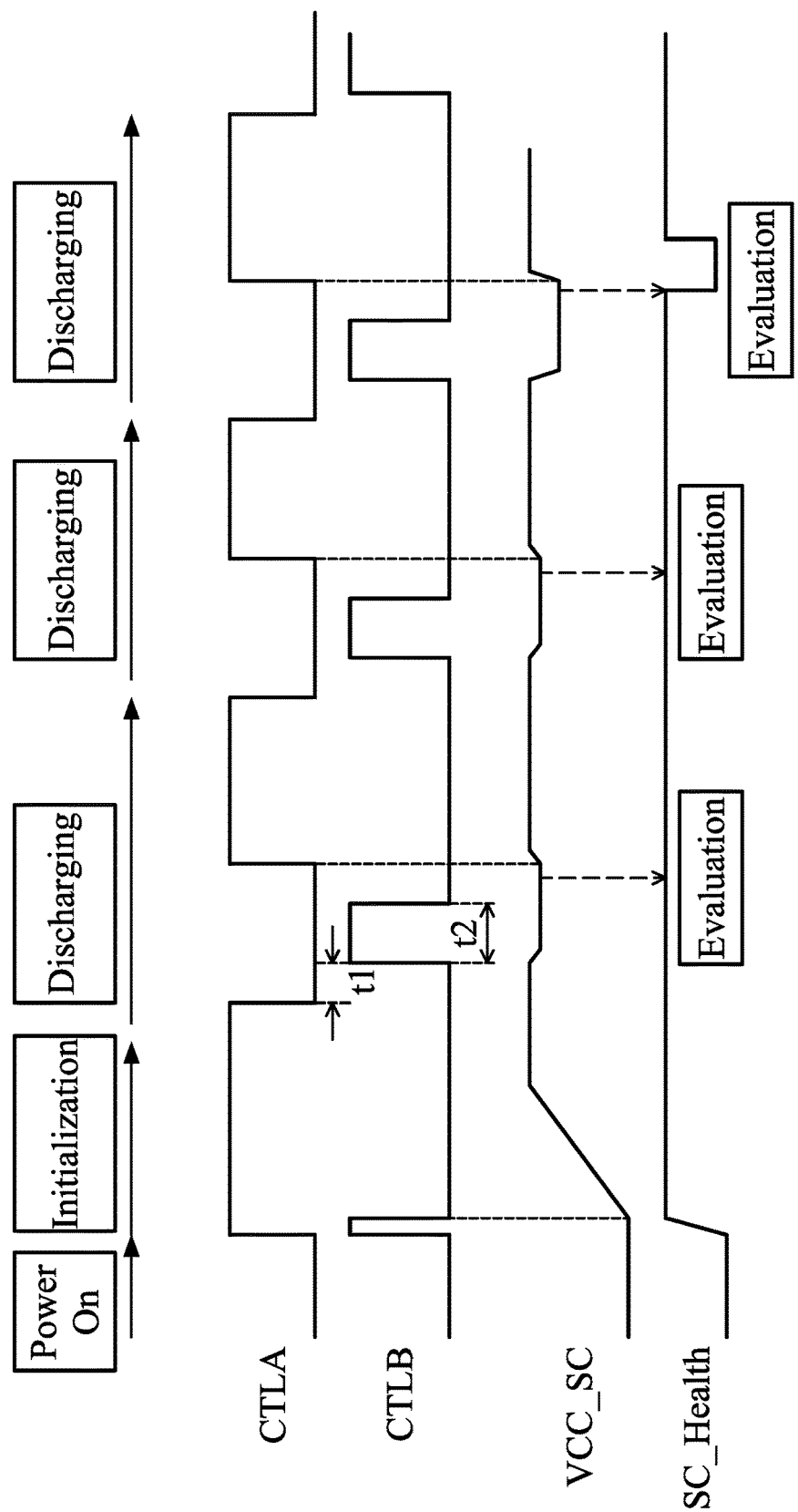
FIG. 8 shows signal waveforms in accordance with an exemplary embodiment of the disclosure.

FIG. 8 shows signal waveforms in accordance with an exemplary embodiment of the disclosure. After the power-on step (S202), the initialization step (S204) is performed to raise the charging path control signal CTLA and the discharging path control signal CTLB. Both the charging path and the discharging path for the capacitor SCAP are established. The data storage device 100 then operates normally, and the charging path may be maintained (with the charging path control signal CTLA kept high) while the discharging path has been broken (with the discharging path control signal CTLB switched to low). After being operated normally for a predetermined time interval, the capacitor SCAP is switched to a discharging stage. A discharging path is established specifically for the capacitor SCAP in step S208. As shown, the discharging path is established (by switching the discharging path control signal CTLB to high) after the charging path has been broken (by switching the charging path control signal CTLA to low) for a predetermined time interval t1 (also called a delay time). The discharging path is maintained during a predetermined time interval t2. After the predetermined time interval t2, the detection of the voltage level VCC_SC of the capacitor SCAP is adopted. An evaluation stage (by step S210) then is performed to compare the dropped voltage level VCC_SC of the capacitor SCAP with the threshold level. As shown, the discharging and the evaluation stages are periodically repeated, which is user friendly to monitor the power storage capability of the capacitor SCAP. As the first and second evaluation show in FIG. 8, the dropped voltage level VCC_SC of the capacitor SCAP is still greater than or equal to the threshold level. Thus, no change happens on the signal SC_Health. The third evaluation, however, shows that the dropped voltage level VCC_SC of the capacitor SCAP is lower than the threshold level. The signal SC_Health immediately reflects this phenomenon. The controller 104, therefore, generates a capacitor-fail evaluation result. In an exemplary embodiment, the capacitor SCAP is regarded as damaged when the capacitor-fail evaluation result is repeatedly obtained N times.

In addition to the forgoing device structure, methods for monitoring the power storage capability of the secondary power of a data storage device is disclosed herein based on the forgoing concepts. In an exemplary embodiment, the monitoring method for the power storage capability of the secondary power source comprises the following steps: controlling a charging path that couples a system power source to a capacitor and controlling a discharging path between the capacitor and a ground terminal, wherein the capacitor is operative to provide secondary power to the data storage device to flush data to the non-voltage space when an unexpected power-off event occurs; and detecting the voltage level of the capacitor to monitor the power storage capability of the capacitor. In an exemplary embodiment, the charging path is broken and the discharging path is established during a predetermined time interval. When the voltage level of the capacitor drops below a threshold level, the capacitor is evaluated as failed. In an exemplary embodiment, the user is informed of the capacitor problem only when the capacitor has been evaluated as having failed N times. In an exemplary embodiment, the detection of the voltage level of the capacitor is adopted when the discharging path has been established for the predetermined time interval.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a capacitor, providing secondary power for the data storage device when an unexpected power-off event occurs;
a charging path switching circuit, selectively providing a charging path for the capacitor;
a discharging path switching circuit, selectively providing a discharging path for the capacitor;
a voltage level detection circuit, detecting and determining whether a voltage level of the capacitor drops below a threshold level and, accordingly, an evaluation result obtained from evaluating the capacitor is generated; and
a controller, controlling the charging path switching circuit and the discharging path switching circuit,
wherein:
after controlling the charging path switching circuit to provide the charging path to charge the capacitor and then controlling the charging path switching circuit to disconnect the charging path and controlling the discharging path switching circuit to provide the discharging path to discharge the capacitor, the controller operates the voltage level detection circuit to detect and determine the voltage level of the capacitor;
a charging path control signal is used to control the charging path switching circuit to provide the charging path; and
a discharging path control signal is used to control the discharging path switching circuit to provide the discharging path, and thereby the charging path and the discharging path are provided separately according to the charging path control signal and the discharging path control signal.

2. The data storage device as claimed in claim 1, wherein:
the controller controls the discharging path switching circuit to provide the discharging path when the charging path has been disconnected for a predetermined time interval.

3. The data storage device as claimed in claim 1, further comprising:
a warning circuit, activated according to the evaluation result.

4. The data storage device as claimed in claim 3, wherein the warning circuit is activated when collected evaluation results show that the voltage level of the capacitor has dropped below the threshold level multiple times.

5. The data storage device as claimed in claim 1, wherein:
the controller activates the voltage level detection circuit for generation of the evaluation result after controlling the discharging path switching circuit to provide the capacitor with the discharging path for a predetermined time interval.

6. The data storage device as claimed in claim 1, wherein:
the charging path switching circuit comprises a switch coupled a resistor that is coupled to a system power source; and
the switch of the charging path switching circuit is operated according to the charging path control signal and the charging path control signal is provided from the controller.

7. The data storage device as claimed in claim 6, further comprising:
a pull-up resistor outside the controller to pull up the charging path control signal in a normal state.

8. The data storage device as claimed in claim 1, wherein:
the discharging path switching circuit comprises a switch coupled between the capacitor and a ground terminal; and
the switch of the discharging path switching circuit is operated according to the discharging path control signal and the discharging path control signal is provided from the controller.

9. The data storage device as claimed in claim 8, further comprising:
a pull-up resistor outside the controller to pull up the discharging path control signal in a normal state.

10. The data storage device as claimed in claim 1, further comprising:
- a voltage divider, generating a divided voltage according to the voltage level of the capacitor; and
- a programmable Zener diode, comprising a control terminal,
- wherein the programmable Zener diode is turned on or off according to a voltage level that changes according to the divided voltage and is applied on the control terminal of the programmable Zener diode and thereby a logic value that changes according to status of the programmable Zener diode is obtained to represent the evaluation result.

11. A method for monitoring power storage capability of a second power source of the data storage device, comprising:
- selectively providing a charging path for the capacitor and selectively providing a discharging path for the capacitor, wherein the capacitor is operative to provide secondary power for the data storage device when an unexpected power-off event occurs; and
- after using the charging path to charge the capacitor and then disconnecting the charging path and using the discharging path to discharge the capacitor, detecting and determining whether the voltage level of the capacitor drops below a threshold level and, accordingly, generating an evaluation result obtained from evaluating the capacitor, wherein:
- a charging path control signal controls whether or not to provide the charging path; and
- a discharging path control signal controls whether or not to provide the discharging path, and thereby the charging path and the discharging path are provided separately according to the charging path control signal and the discharging path control signal.

12. The method as claimed in claim 11, wherein:
the discharging path is established when the charging path has been disconnected for a predetermined time interval.

13. The method as claimed in claim 11, further comprising:
providing a warning circuit, activated according to the evaluation result.

14. The method as claimed in claim 13, wherein the warning circuit is activated when collected evaluation results show that the voltage level of the capacitor has dropped below the threshold level multiple times.

15. The method as claimed in claim 11, wherein:
the voltage level of the capacitor is detected and determined for generation of the evaluation result after the discharging path has been established for the capacitor for a predetermined time interval.

16. The method as claimed in claim 11, providing a switch that is operated according to the charging path control signal to provide the charging path, wherein the switch is coupled to a resistor that is coupled to a system power source.

17. The method as claimed in claim 16, further comprising:
providing a pull-up resistor to pull up the charging path control signal in a normal state.

18. The method as claimed in claim 11, providing a switch between the capacitor and a ground terminal to be operated according to the discharging path control signal to provide the discharging path.

19. The method as claimed in claim 18, further comprising:
providing a pull-up resistor to pull up the discharging path control signal in a normal state.

20. The method as claimed in claim 11, further comprising:
- generating a divided voltage according to the voltage level of the capacitor; and
- providing a programmable Zener diode that comprises a control terminal,
- wherein the programmable Zener diode is turned on or off according to a voltage level that changes according to the divided voltage and is applied on the control terminal of the programmable Zener diode and thereby a logic value that changes according to status of the programmable Zener diode is obtained to represent the evaluation result.

* * * * *